US011174806B2

United States Patent
Gose et al.

(10) Patent No.: US 11,174,806 B2
(45) Date of Patent: Nov. 16, 2021

(54) OXYGEN SENSOR SYSTEM AND METHOD

(71) Applicant: DELPHI TECHNOLOGIES IP LIMITED, St. Michael (BB)

(72) Inventors: Mark W. Gose, Kokomo, IN (US); Jerry W. Campbell, Carmel, IN (US); Eugene V. Ripley, Russiaville, IN (US); Marc R. Engelhardt, Kokomo, IN (US); Jingyi Hou, Westfield, IN (US)

(73) Assignee: DELPHI TECHNOLOGIES IP LIMITED

( * ) Notice: Subject to any disclaimer, the term of this patent is extended or adjusted under 35 U.S.C. 154(b) by 222 days.

(21) Appl. No.: 16/599,621

(22) Filed: Oct. 11, 2019

(65) Prior Publication Data

US 2021/0108585 A1 Apr. 15, 2021

(51) Int. Cl.
*F02D 41/14* (2006.01)
*F01N 11/00* (2006.01)
*G01R 27/02* (2006.01)

(52) U.S. Cl.
CPC ........ *F02D 41/1456* (2013.01); *F01N 11/007* (2013.01); *G01R 27/02* (2013.01); *F01N 2560/025* (2013.01)

(58) Field of Classification Search
CPC ............. F02D 41/1456; F02D 41/1495; F02D 41/222; F02D 2041/2086; F02D 2041/2009; F01N 11/007; F01N 2560/025; F01N 9/00; G01R 27/02; F02N 2900/06; F02N 2900/0422
See application file for complete search history.

(56) References Cited

U.S. PATENT DOCUMENTS

| | | | | |
|---|---|---|---|---|
| 6,096,186 A | * | 8/2000 | Warburton | G01N 33/007 204/401 |
| 6,214,209 B1 | * | 4/2001 | Gruenwald | G01N 27/4071 205/784.5 |
| 7,444,235 B2 | | 10/2008 | Anilovich et al. | |
| 9,297,843 B2 | | 3/2016 | Gibson et al. | |
| 2005/0096806 A1 | | 5/2005 | Diem | |
| 2014/0076741 A1 | * | 3/2014 | Adams | G01N 27/4163 205/785.5 |
| 2016/0327512 A1 | * | 11/2016 | Reinhardt | G01N 27/4065 |
| 2018/0164266 A1 | * | 6/2018 | Hasse | G01N 33/0006 |
| 2018/0202986 A1 | * | 7/2018 | Knoefler | G01N 33/0037 |
| 2020/0144637 A1 | * | 5/2020 | Wagner | F24F 11/80 |

* cited by examiner

Primary Examiner — George C Jin
(74) Attorney, Agent, or Firm — Joshua M. Haines

(57) ABSTRACT

A method of operating an oxygen sensor system is provided where the system includes an oxygen sensor, the oxygen sensor including a pump cell, and wherein the oxygen sensor is connected to associated circuitry such that the associated circuitry controls operation of the pump cell. The pump cell includes a pump line connected to a pump electrode of the pump cell and a return line connected to a return electrode of the pump cell. The method includes, subsequent to a diagnostic process, raising the potential of the pump line for a predetermined period of time by injecting current onto the pump line.

14 Claims, 6 Drawing Sheets

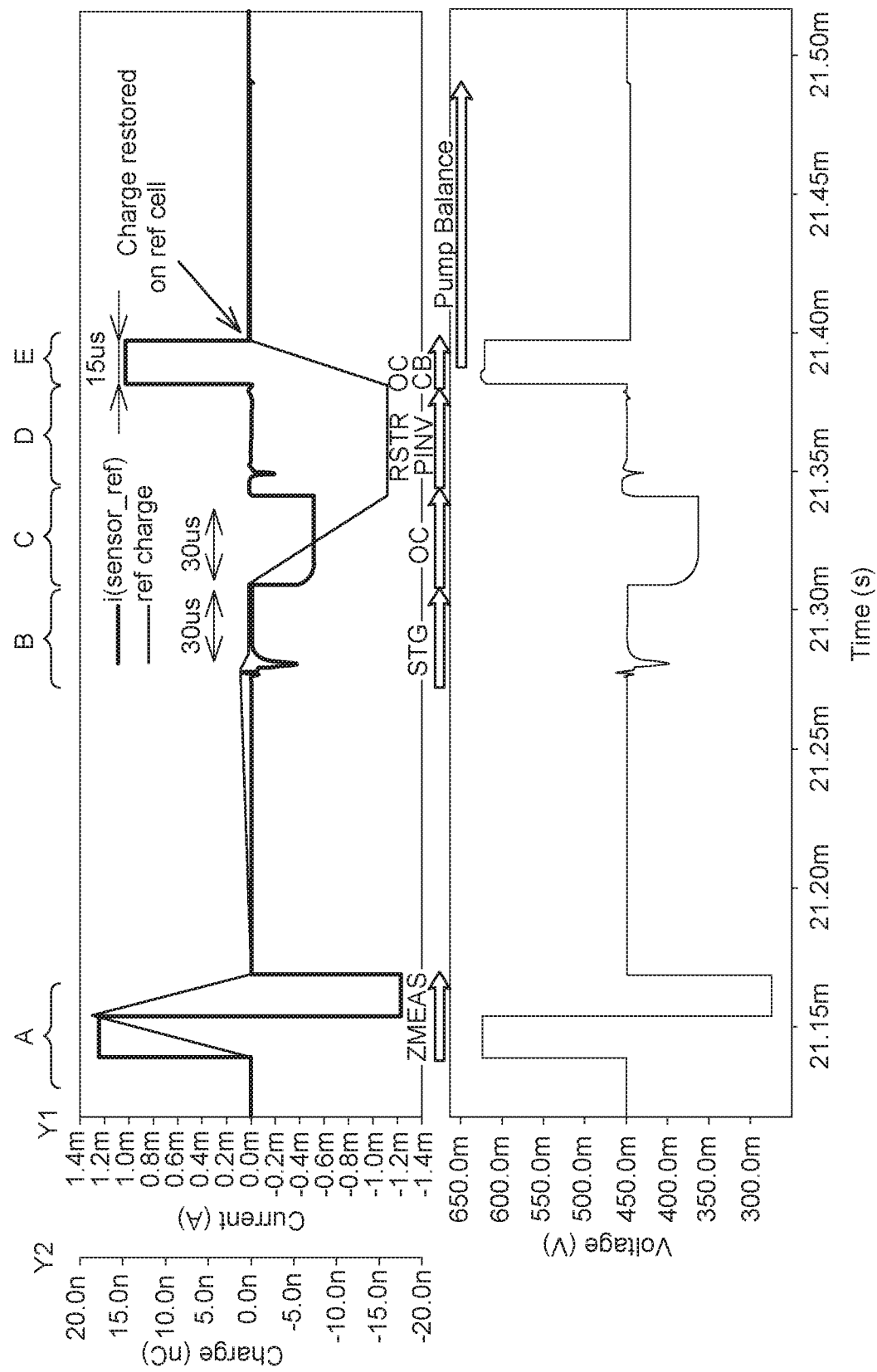

OXYGEN SENSOR SYSTEM AND METHOD

TECHNICAL FIELD OF INVENTION

This disclosure relates to oxygen (O2) sensors and systems using such sensors, and typically such sensors used in vehicle systems to determine oxygen levels in e.g. exhausts. Such sensors are often referred to as lambda sensors. It has application to both two-cell and one-cell lambda sensors.

BACKGROUND OF INVENTION

Typically, an O2 sensor is mounted in the exhaust manifold to monitor how much unburned oxygen is in the exhaust as the exhaust gases exit the engine. Monitoring oxygen levels in the exhaust is a way of gauging the fuel mixture.

A lambda sensor is based on a solid-state electrochemical fuel cell. Its electrodes provide an output voltage corresponding to the quantity of oxygen in the exhaust relative to that in the atmosphere.

The measurement or reference cell is arranged in contact with the outside air externally and on the other side to the measurement chamber. Opposite to the measurement cell is a pump cell, adapted to pump oxygen into or out of the measurement chamber by means of an electric current. A small amount of exhaust gas can flow into the measurement chamber via a small channel. A change of oxygen concentration in the measurement chamber, consequently changes the measurement or reference cell voltage from its reference value of e.g. 450 mV. To return the measurement cell reference voltage back to 450 mV, current is sent through the pump cell. Depending on the direction and amount of current, oxygen ions can be pumped into or out of the measurement chamber to return the measurement cell voltage to 450 mV.

A control loop as part of an O2 sensor interface circuitry such as an interface IC, connected between the sensor and microprocessor, regulates the reference cell voltage by adjusting the pump current.

Periodically, a diagnostic routine needs to run to test the connections of the sensor to the interface IC, e.g. to check for ground faults. A problem with this is that there is disruption to the system, such as the closed loop control is disrupted and charge values of the cells of the sensor are disrupted.

There are two primary causes of the disruption. In a first cause, this is due to the opening of the pump control loop during the diagnostic period. While the pump loop is opened, the pump current required to maintain the desired reference cell voltage is not available so the sensor deviates from its desired operating point. After the diagnostic is complete, the loop is closed again, but the error accumulated on the cells during the diagnostic causes a disturbance in the control loop.

The other cause is due to the open circuit diagnostic mechanism. During the diagnostic, normal operation of the interface is suspended, the return line of the sensor (SRTN) is pulled high and the reference cell, tag resistor, and pump cell interfaces are pulled low. This action causes charge to be pulled out of the reference cell and the pump cells. When the diagnostic is complete, pump current readings do not reflect actual gas conditions until the charge removed during the diagnostic is restored. It takes time for the control loop to bring the sensor back to proper operation.

It is an object of the invention to overcome these problems.

SUMMARY OF THE INVENTION

Briefly described, a method of operating an oxygen sensor system is provided where the system includes an oxygen sensor, the oxygen sensor including a pump cell, and wherein the oxygen sensor is connected to associated circuitry, the associated circuitry adapted to control operation of the pump cell, where the pump cell includes a pump line connected to a pump electrode of the pump cell and a return line connected to a return electrode of the pump cell, having first means connected to the pump line to pump current to or from the pump cell to maintain pump cell at a nominal voltage during operation, the pump line and return lines being connected to ground via respective capacitances. The method comprises, subsequent to a diagnostic process, raising the potential of the pump line for a predetermined period of time by injecting current onto the pump line.

An oxygen sensor system is also provided. The system includes an oxygen sensor with a pump cell having a pump line connected to a pump electrode of the pump cell and a return line connected to a return electrode of the pump cell, the pump line and the return line being connected to ground via respective capacitances. The system also includes associated circuitry connected to the oxygen sensor, the associated circuitry adapted to control operation of the pump cell and having first means connected to the pump line to pump current to or from the pump cell to maintain the pump cell at a nominal voltage during operation and further configured to, subsequent to a diagnostic process, raise the potential of the pump line for a predetermined period of time by injecting current onto the pump line.

BRIEF DESCRIPTION OF DRAWINGS

The present invention is now described by way of example with reference to the accompanying drawings in which:

FIG. 2b shows a plot similar to FIG. 2a, but over a longer time period; and

DETAILED DESCRIPTION OF INVENTION

Background

As mentioned, a lambda sensor is based on a solid-state electrochemical fuel cell. Its two electrodes provide an output signal corresponding to the quantity of oxygen in the exhaust relative to that in the atmosphere.

In one system, a measurement or reference cell is arranged in contact with the outside air externally and on the other side to the measurement chamber. Opposite to the measurement cell is a pump cell, adapted to pump oxygen into or out of the measurement chamber by means of an electric current. A small amount of exhaust gas can flow into the measurement chamber via a small channel. A change of oxygen concentration in the measurement chamber, consequently changes the measurement or reference cell voltage from its reference value of e.g. 450 mV. To return the measurement cell reference voltage back to 450 mV, current is sent through the pump cell. Depending on the direction and amount of current, oxygen ions can be pumped into or out of the measurement chamber to return the measurement cell voltage to 450 mV. A control loop as part of an O2 sensor interface circuitry such as an interface IC, connected between the sensor and microprocessor, regulates the reference cell voltage by adjusting the pump current.

Figure 1A:
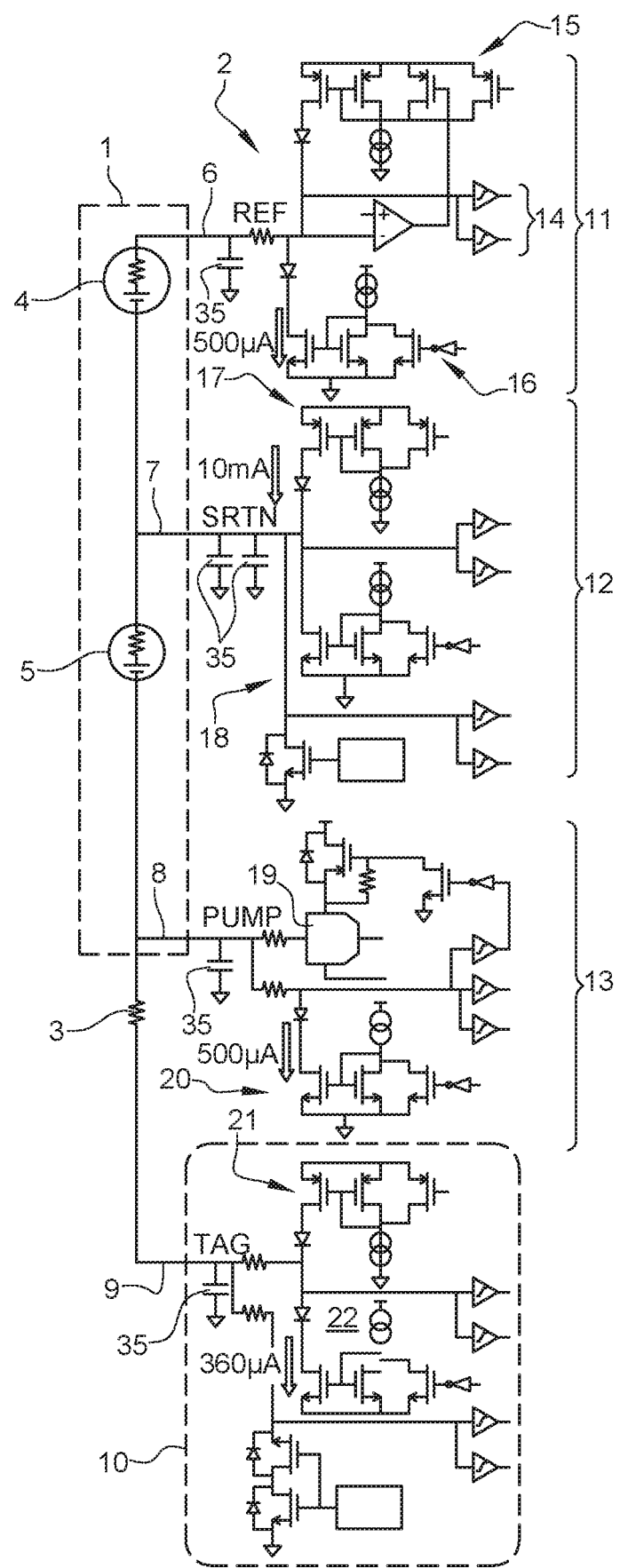
FIGS. 1a and 1b shows a schematic representation of salient portions of a two-cell and single-cell sensor O2 sensor system respectively.

FIG. 1a shows a schematic representation of a portion of an O2 sensor system showing salient portions relevant to aspects of the invention. The sensor shown is a 2-cell O2 sensor 1, connected to sensor interface IC or circuitry 2; this is typically connected between the sensor and a general controlling microprocessor (not shown).

The sensor (element) is shown schematically but includes a reference (REF) or measurement cell 4 and a pump cell 5. The two cells are separated on sides by a porous diffusion component (which provides/defines a porous diffusion passage) so as to form a gas detecting cavity. Electrodes are located on either side of the cells and provide appropriate input and outputs to the other parts (circuitry) of the system as shown.

The oxygen sensor is connected to associated diagnostic circuitry 2 which may comprise intermediate circuitry (generally designated with reference numeral 2) between the sensor itself and a microprocessor, via three lines. Line 6 is the REF terminal, line 7 is the SRTN terminal which is common to appropriate terminals (electrodes) on both the pump and reference cells, and line 8 is the PUMP terminal. Lines 6, 7 and 8 are connected to associated circuitry designated 11, 12 and 13 respectively. These lines are connections to the electrodes and hereinafter reference to the lines and electrodes can be considered as interchangeable.

In the figure is additionally shown a TAG resistor 3 and TAG line 9 to TAG circuitry 10 which again can be considered or embodied as part of the intermediates or associated circuitry. This is an optional feature and the TAG set-up is commonly used to trim out sensor variations.

The circuitry connected to the REF terminal generally provides outputs 14 (after appropriate amplifications) which are used to compare the output to defined threshold voltages for determining shorts to ground or open circuit conditions. Connected to the REF line 6 is provided pull-up circuitry generally designated 15 and pull down circuitry generally designated 16.

Regarding the SRTN line 7, this generally is used to control the sensor in a way as to e.g. change the potential of the relevant terminals of the pump and reference cells during and between various processes such as measurement, testing, resetting and diagnostic process. It also allows the sensor common to be disconnected from ground in the event of a short to battery on one of the sensor wires. Generally provided for this is a pull-up circuitry 17 and pull down circuitry 18. It should be noted that this circuitry can be controlled by the microprocessor.

The pump cell line 8 is connected to circuitry which provides a current to be pumped into the pump cell dependent on the output of the REF line 6 and its subsequent comparison to the standard 450 mV. The pump current is provided as an output of a digital to analog converter (DAC) 19. Circuitry which provided the input to the DAC is not shown, but essentially this comprises mainly (includes) a digital compensator which may be programmable and provides an output to the DAC dependent on the comparison. Pull-down circuitry 20 is provided as shown.

The TAG circuitry includes pull up and pull down circuitry 21 and 22 respectively.

Figure 1B:
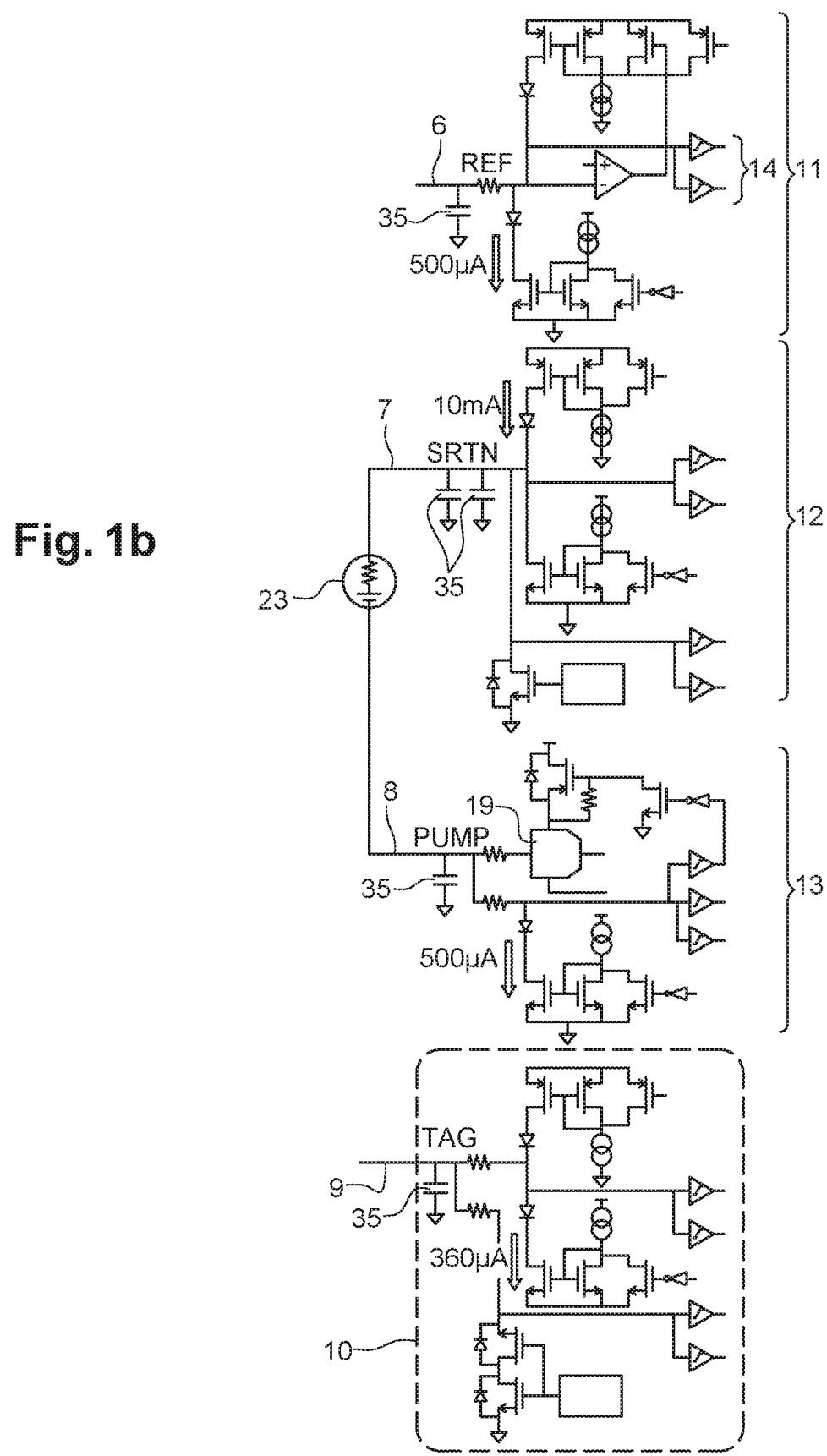

FIG. 1b shows similar circuitry for a 1-cell sensor 23. The circuitry 2 in the interface IC (C3WRAF) may be the same as in FIGS. 3a and 3b since the interface IC is designed to drive either two-cell or one-cell sensors. In the case of a one cell sensor, the REF and TAG pins are not connected at the module level. The interface IC is programmed by the microprocessor to pull down on REF and PUMP as shown with the 500 μA and 360 μA in FIG. 1b just so that nodes are not floating.

Capacitors 35 are connected to the REF,SRTN PUMP and TAG lines.

During diagnostic testing, the following procedure may take place:

a) First, the power switch in the SRTN circuitry is switched off.

b) Thereafter current into the sensor terminals is applied by the pull up circuitry 15, 17, 21 along with current DAC 19. This is designed to pull the signals up to ~+5V, i.e. raise all the lines REF, SRTN PUMP and TAG. The voltages on these sensor lines are compared to predefined thresholds via outputs 14 for the purpose of short to ground testing. Here, the current level for each pin is chosen to charge the capacitor on each respective pin at the same rate to minimize current flowing into the REF and PUMP cells.

c) Thereafter, the pull up circuitry 17 is left on to keep SRTN at around +5V and the pulldown circuits 16, 20, 22 are turned on acting as current sinks. If the sensor is at operating temperature and the sensor lines are not open, the current sinks will not be able to pull the REF, PUMP, or TAG lines down due to the low impedance of the sensor. The sensor line voltages are compared to predefined thresholds by outputs 14 to detect an open connection.

In the operation of wide-range oxygen sensors, diagnostic tests cause a disruption in the operating point of the sensor, consequently resulting in errors in the indicated air/fuel ratio. Though some specifics differ, the disruption occurs in both one-cell and two-cell sensors.

Problem

A primary cause of disruption is due to the open circuit diagnostic mechanism. During the diagnostic, normal operation of the interface is suspended, the return line of the sensor is pulled high and the reference cell, TAG resistor, and pump cell interfaces are pulled low. This action causes charge to be pulled out of the reference and the pump cells. When the diagnostic is complete, pump current readings do not reflect actual gas conditions until the charge removed during the diagnostic is restored. It takes time for the loop to rebalance the sensor.

Figure 2A:
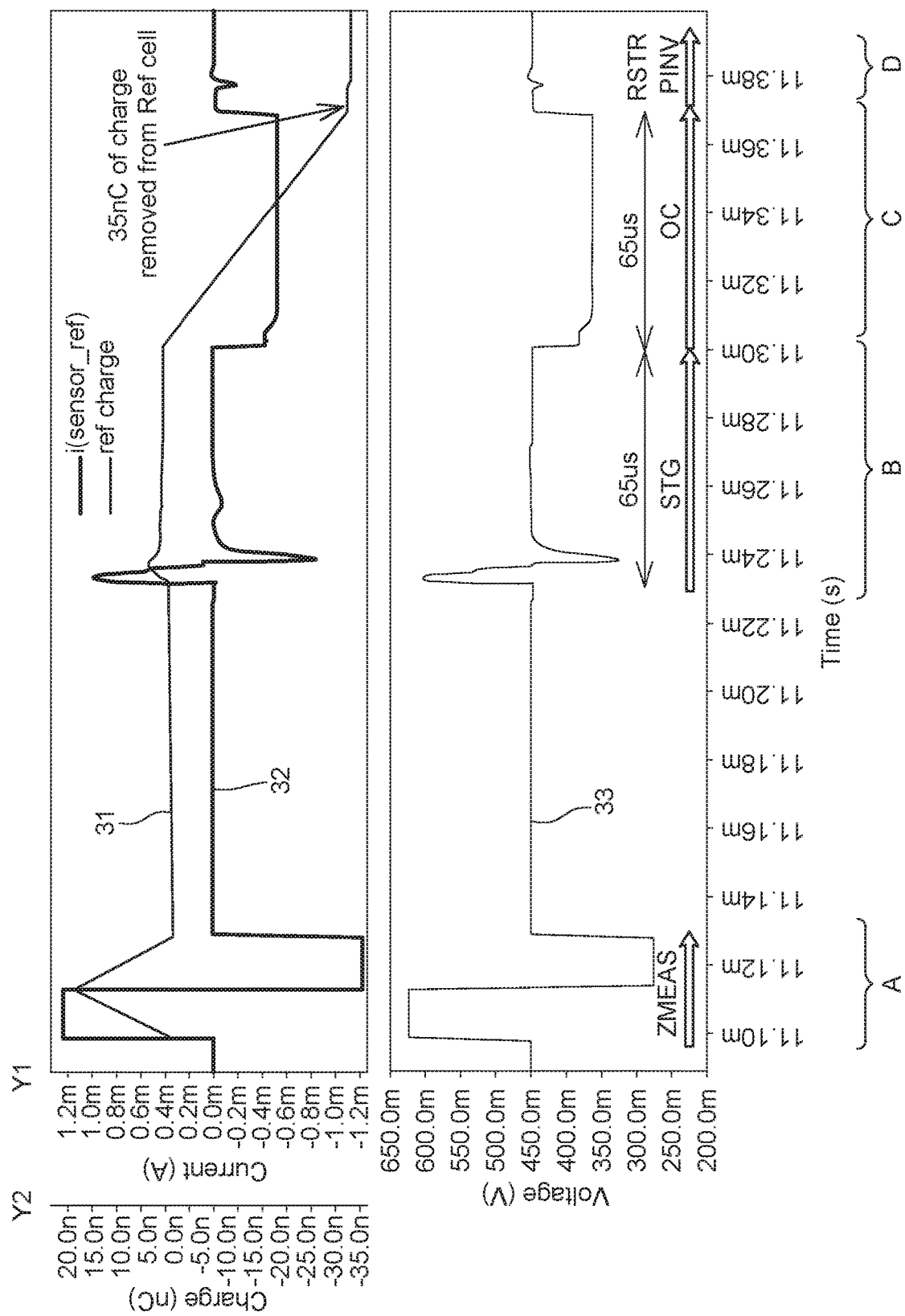
FIG. 2a shows a plot showing the charge being removed from the reference cell of a 2-cell sensor due to a diagnostic process.

FIG. 2a shows how the charge is removed from the reference cell of a two-cell sensor due to the diagnostic process for a hot sensor where λ=1. The figure shows a plot of the reference charge 33 (that is the charge on the REF line) against time as well as current (I) 32 on the sensor REF line. Period A is the time when the sensor cell impedance measurements are taken to provide for sensor temperature control, typically referred to as "Z" (impedance) measurement or Zmeas for short.

The diagnostic period spans the time intervals of B and C which are the short to ground testing phase and the open circuit testing phase respectively. The bottom plot 33 shows the voltage across the REF cell. As can be seen at the end of the open circuit test phase 35nC of charge has been removed from the ref cell. Similarly, charge is lost from the PUMP cell from the open circuit diagnostic. This loss of charge from the REF and PUMP cells will cause sensor reading errors for a period of time before the loop can return the sensor to its proper operating point. Time interval D called RSTR PINV pulls the SRTN, REF, PUMP and optionally the TAG lines down together with their respective current sinks prior to re-enabling the main SRTN switch 18. This prevents a large current spike from the sensor line capacitors when the switch is activated.

Invention

In aspects of the invention, means is provided subsequent to diagnostic testing, to provide a pull-up current to restore the charge lost in the PUMP and REF cell during the open circuit testing of the sensor lines.

Figure 3A:
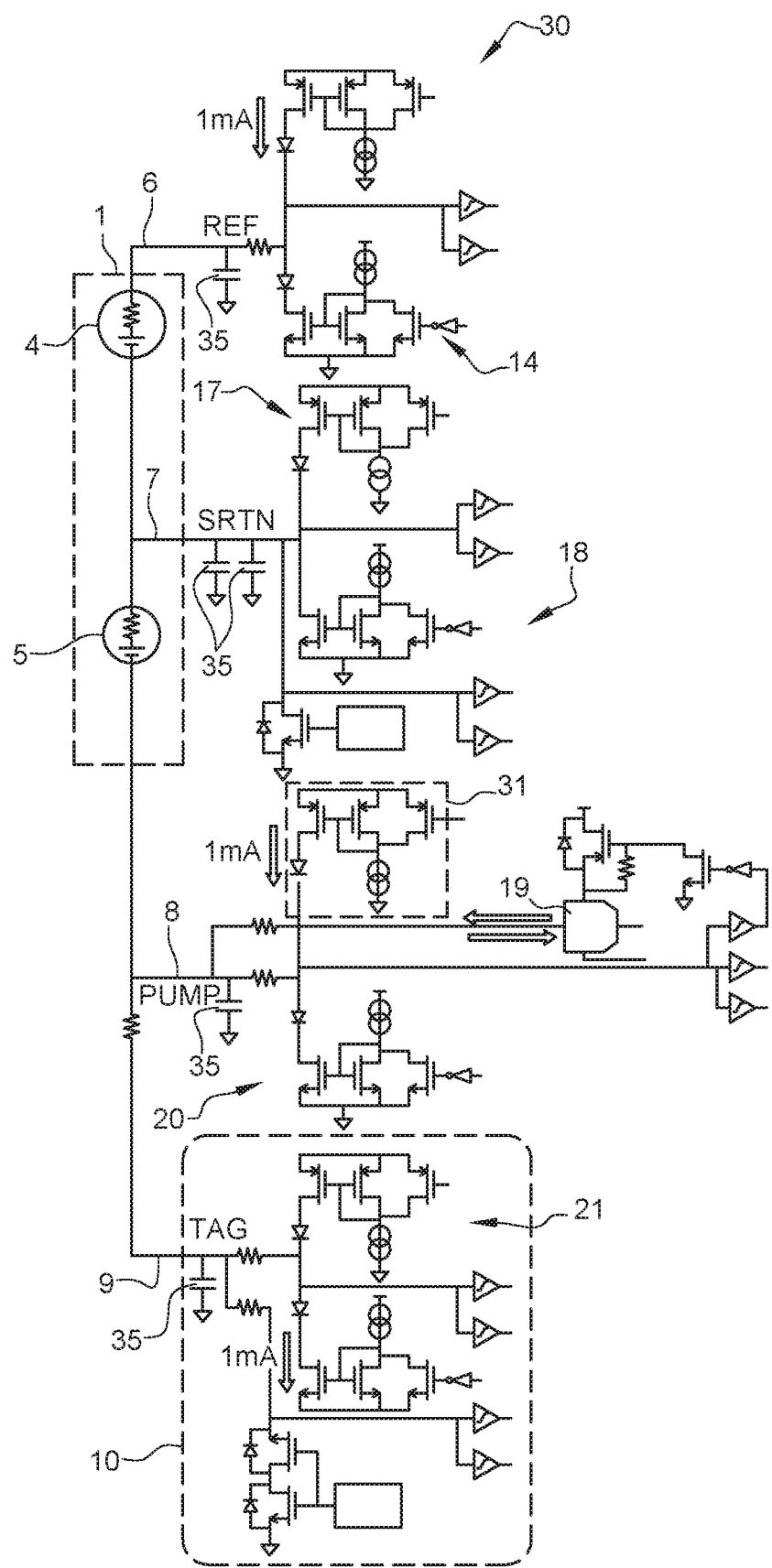
FIGS. 3a and 3b illustrate examples of the invention applicable to 2-cell and 1-cell O2 sensor systems respectively.
Figure 3B:
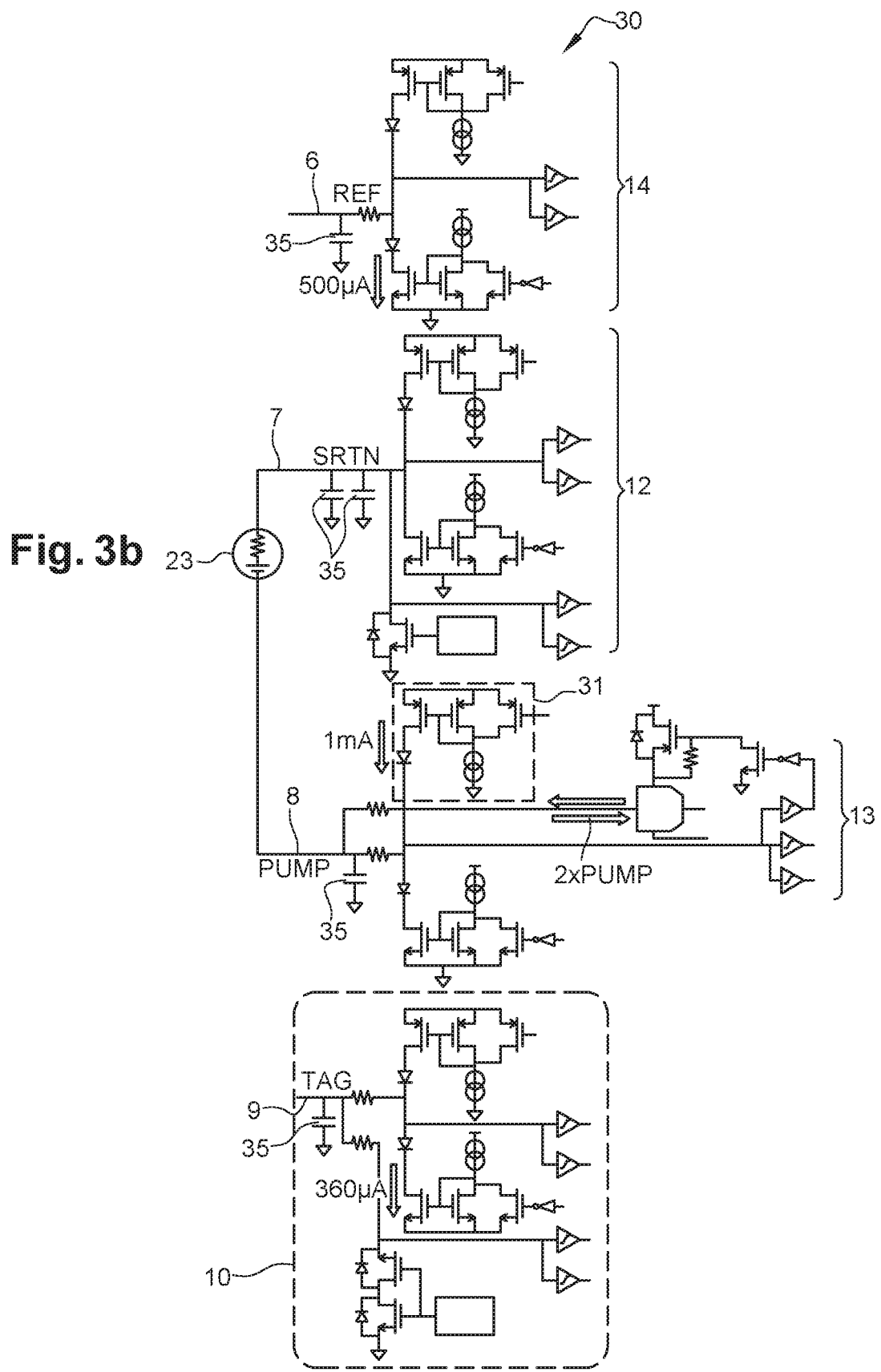

FIGS. 3a and 3b illustrate examples of the invention applicable to 2-cell and 1-cell O2 sensor systems respectively, and show circuitry which can be used to implement the invention. The circuitry is similar and like reference numerals designate the like component referenced in FIGS. 1a and 1b respectively. The main differences are that the pull up circuitry 30 of the REF circuitry is slightly modified and there is provided additional pull-up circuit 31 connected to the PUMP line; 31 may be considered as a means to inject current onto the pump line. The added pull-up circuitry connected to the PUMP line 8 comprises essentially a current source which is adapted to provide a current of e.g. 1 mA as shown by the arrow.

Aspects of the invention are provided such that subsequent to the open circuit diagnostic step where the sensor lines except for SRTN have had current sinks applied, current (e.g. 1 mA) is pumped into the REF cell and PUMP cell terminals/lines (and optionally TAG line) in order to restore the charge removed during the open circuit diagnostic. This brings the REF and PUMP cells back to the state of charge prior to the open circuit diagnostic. This open circuit charge balance is completed after the restore pinv step where the SRTN switch is re-enabled. The current sources are provided for a short period of time, the duration of which can be selected and the skilled person would readily be aware of appropriate time periods. This aspect is independent of whether or not the oxygen sensor has become unbalanced so thus independent of air/fuel ratio.

The requisite current in the case of the REF line is provided by the modified pull up circuitry 30, and the requisite current for PUMP line is provided by the added circuitry 31 and the optional TAG line may be provided by existing pull up circuitry 21.

In an example, the open circuit diagnostic process applies 500 μA pulldown current sources to the REF cell, PUMP cell and TAG resistor interface with the SRTN pull up 17 enabled. After the diagnostic process is complete, in an example methodology (charge balance process) applies an e.g. 1 mA pull-up current sources on these three (REF cell, PUMP cell and TAG resistor) lines/interfaces for a period of time (e.g. one half the time they were pulled down) with the SRTN switch 18 enabled. This process restores the charge that was removed during the diagnostic.

In the case of the PUMP line, although the DAC can pump current into or out of the pump line (and hence pump cell) to provide the requisite current to the pump line after diagnostic is very difficult to implement using the DAC which is mainly for closed loop control of the pump current. So preferably extra circuitry 31 is provided to provide the requisite "re-charge" current allowing matching in both timing and magnitude to the other current sources for the REF, TAG and SRTN lines. Additional circuitry 31 is thus provided as shown by reference numeral which is essentially a switchable current source (e.g. 1 mA current sources).

Aspects are also applicable to a 1-cell system. As mentioned, FIG. 1b shows a 1-cell system comprising a single cell 23 oxygen sensor which has connections to associated circuitry via SRTN line and PUMP line. The system includes the same circuitry as for the 2-cell sensor Like circuitry is numbered with the same reference numerals. FIG. 3b again illustrates how the system may be adapted in examples of the invention. Again, additional circuitry 31 may be provided connected to the PUMP line to provide the re-charge current (e.g. 1 mA). In the 1-cell methodology, the after diagnostic re-charge current is applied to the PUMP line.

In summary the invention uses resources within a modified integrated circuit (IC) to restore the charge removed during the diagnostic process. Errors due to the charge transfer on the sensor are accommodated.

FIG. 2b shows a plot similar to FIG. 2a over a longer time span and shows how the methodology is used. Like reference numerals designate the same as in FIG. 2a. As before there is a short circuit procedure test period followed by an open circuit test period, as a consequent of which the charge and this charge/voltage is removed from the REF cell lines. After the Open Circuit (OC) test period C, is a small RSTR PINV period D followed by period E, where the methodology according to examples of the invention are performed. This period E can be referred to as an open circuit charge balance (OC CB) where according to the invention for a period of time (here 15 μs) current is pumped onto the PUMP and REF lines and optionally the TAG line to restore the charge thereon on the PUMP and REF cells. The net charge transfer returns to nearly zero after the procedure is complete.

We claim:

1. A method of operating an oxygen sensor system, said system including an oxygen sensor, said oxygen sensor including a pump cell, and wherein said oxygen sensor is connected to associated circuitry, said associated circuitry adapted to control operation of said pump cell, where said pump cell includes a pump line connected to a pump electrode of the pump cell and a return line connected to a return electrode of the pump cell, having first means connected to the pump line to pump current to or from said pump cell to maintain said pump cell at a nominal voltage during operation, said pump line and return lines being connected to ground via respective capacitances, said method comprises:

subsequent to a diagnostic process, raising the potential of the pump line for a predetermined period of time by injecting current onto the pump line.

2. A method as claimed in claim 1, including subsequent to the diagnostic process, raising the potential of the return line for a predetermined period of time by injecting current onto the return line.

3. A method as claimed in claim 2, wherein raising the potential of the pump line for a predetermined period of time by injecting current onto the pump line is provided by second additional means to pump current onto the pump line.

4. A method as claimed in claim 1, wherein said oxygen sensor is a two-cell sensor including a reference cell, having a first electrode thereof connected the return line, and a second electrode connected via a reference line to said associated circuitry, said reference line being connected to ground via a respective capacitance, said method including subsequent to the diagnostic process, raising the potential of the reference line for a predetermined period of time by injecting current onto the reference line.

5. A method as claimed in claim 1, wherein said pump cell is connected via a TAG resistor to said associated circuitry via a TAG line, said TAG line being connected to ground via respective capacitance, said method including subsequent to the diagnostic process, raising the potential of the TAG line for a predetermined period of time by injecting current onto the TAG line.

6. A method as claimed in claim 1 wherein, said diagnostic process includes an open circuit test routine.

7. A method as claimed in claim 6, wherein during said open circuit test routine, the potential of said return line and/or said pump line is/are lowered.

8. An oxygen sensor system comprising:
  an oxygen sensor, said oxygen sensor including a pump cell having a pump line connected to a pump electrode of the pump cell and a return line connected to a return electrode of the pump cell, said pump line and said return line being connected to ground via respective capacitances; and
  associated circuitry connected to said oxygen sensor, said associated circuitry adapted to control operation of said pump cell and having first means connected to the pump line to pump current to or from said pump cell to maintain said pump cell at a nominal voltage during operation and further configured to, subsequent to a diagnostic process, raise the potential of the pump line for a predetermined period of time by injecting current onto the pump line.

9. A system as claimed in claim 8, further configured to, subsequent to the diagnostic process, raise the potential of the return line for a predetermined period of time by injecting current onto the return line.

10. A system as claimed in claim 8, including second additional means adapted to pump current onto the pump line to raise the potential of the pump line for a predetermined period of time.

11. A system as claimed in claim 8, wherein said oxygen sensor is a two-cell sensor including a reference cell, having a first electrode thereof connected the return line, and a second electrode connected via a reference line to said associated circuitry, said reference line being connected to ground via a respective capacitance, said associated circuitry further configured to, subsequent to the diagnostic process, raise the potential of the reference line for a predetermined period of time injecting current onto the reference line.

12. A system as claimed in claim 8, wherein said pump cell is connected via a TAG resistor to said associated circuitry via a TAG line, said TAG line being connected to ground via a respective capacitance, and configured to, subsequent to said diagnostic process, raise the potential of the TAG line for a predetermined period of time by injecting current onto the TAG line.

13. A system as claimed in claim 8, wherein said diagnostic process includes an open circuit test routine.

14. A system as claimed in claim 13, wherein during said open circuit test routine, the potential of said return line and/or said pump line is/are lowered.

* * * * *